United States Patent
Ozawa

Patent Number: 5,461,249
Date of Patent: Oct. 24, 1995

[54] NONVOLATILE SEMICONDUCTOR MEMORY DEVICE AND MANUFACTURING METHOD THEREFOR

[75] Inventor: Takanori Ozawa, Kyoto, Japan

[73] Assignee: Rohm Co., Ltd., Kyoto, Japan

[21] Appl. No.: 280,376

[22] Filed: Jul. 26, 1994

Related U.S. Application Data

[63] Continuation of Ser. No. 967,745, Oct. 28, 1992, abandoned.

[30] Foreign Application Priority Data

Oct. 31, 1991  [JP]  Japan .................................. 3-313311
Oct. 31, 1991  [JP]  Japan .................................. 3-313312

[51] Int. Cl.⁶ .................................................. H01L 29/788
[52] U.S. Cl. ........................... 257/321; 257/316; 257/322; 365/185.01
[58] Field of Search ................................. 257/315, 316, 257/321, 322; 365/185

[56] References Cited

U.S. PATENT DOCUMENTS

| | | | |
|---|---|---|---|
| 4,087,795 | 5/1978 | Rossler | 257/321 |
| 4,882,707 | 11/1989 | Mizutani | 257/316 |
| 5,051,793 | 9/1991 | Wang | 257/316 |
| 5,138,573 | 8/1992 | Jeuch | 365/185 |

*Primary Examiner*—Jerome Jackson
*Attorney, Agent, or Firm*—Brumbaugh, Graves Donohue & Raymond

[57] ABSTRACT

A drain diffusion layer acting as a drain of both of a memory transistor and a selection transistor, and a source diffusion layer acting as a source of both of the memory transistor and the selection transistor are formed in a semiconductor substrate. A floating gate having a convex upper surface is formed on a tunnel insulating film in the vicinity of the drain diffusion layer. A common gate acting both as a control gate of the memory transistor and as a gate of the selection transistor is formed such that its one end is located over the floating gate and the other end is located in the vicinity of the source diffusion layer.

1 Claim, 7 Drawing Sheets

NONVOLATILE SEMICONDUCTOR MEMORY DEVICE AND MANUFACTURING METHOD THEREFOR

This application is a continuation of application Ser. No. 07/967,745 filed on Oct. 28, 1992 abandoned.

BACKGROUND OF THE INVENTION

The present invention relates to nonvolatile semiconductor memory devices such as an EEPROM (electrically erasable and programmable ROM) and a manufacturing method therefor.

A full-future-type EEPROM and a flash-type EEPROM are conventionally known as nonvolatile semiconductor memory devices.

Figure 6:
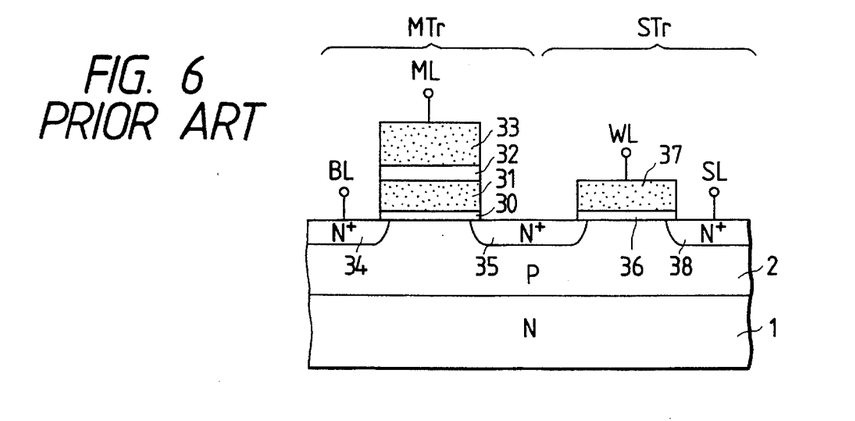
FIG. 6 is a sectional view showing a device structure of a conventional full-future-type EEPROM.
Figure 7:
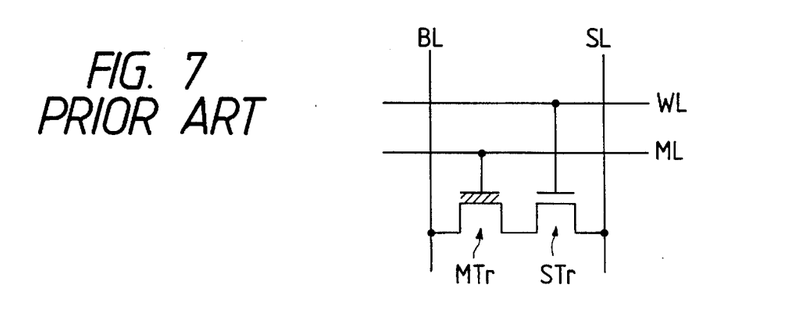
FIG. 7 is a circuit diagram showing part of a memory device employing the devices of FIG. 6.

FIG. 6 shows a device structure of the full-future-type EEPROM, and FIG. 7 is a circuit diagram showing part of a memory device formed by connecting such devices in a matrix form. As shown in FIG. 6, the full-future-type EEPROM has a memory cell consisting of a memory transistor MTr and a selection transistor STr that are formed in a p-well 2 of an n-type silicon substrate 1. The memory transistor MTr includes a gate structure consisting of a tunnel oxide film 30, a floating gate 31, an insulating film 32 and a control gate 33, and $n^+$ diffusion layers 34, 35 that are formed in the p-well 2 on both sides of the gate structure. The selection transistor STr includes a gate structure consisting of a gate oxide film 36 and a gate 37, and an $n^+$ diffusion layers 35, 38.

Referring to FIG. 7, data write, erase and read operations to the full-future-type EEPROM are described below.

The data writing is performed as follows. Positive voltages are applied to a bit line BL and a memory line ML that is connected to the control gate 33 of the memory transistor MTr of the selected device, respectively. At the same time, a positive voltage is applied to a word line WL that is connected to the gate 37 of the selection transistor STr of the selected device, and a source line SL is grounded. As a result, hot electrons generated in the vicinity of the $n^+$ diffusion layer (drain) 34 of the memory transistor MTr are injected into the floating gate 31 through the tunnel oxide film 30, so that signal charge is written.

The data erasing is performed as follows. A positive voltage is applied to the bit line BL of the selected device, and the memory line ML is grounded. As a result, the charge stored in the floating gate 31 is transferred from the floating gate 31 to the $n^+$ diffusion layer 34 through the tunnel oxide film 30. Thus, the signal charge is erased.

The data reading is performed as follows. The source line SL of the selected device is grounded, and a positive voltage is applied to the word line WL. At the same time, a positive voltage is applied to the bit line BL of the selected device, and a positive low voltage is applied to the memory line ML. If no current flows through the selection transistor STr in this state, which means that the memory transistor MTr is in a written state, data "1" is read out. On the other hand, if a current flows through the selection transistor Str, which means that the memory transistor MTr is in an unwritten state, data "0" is read out.

Next, a structure of the flash-type EEPROM is described. A stack gate structure of FIG. 8 and a split gate structure of FIG. 9 are two typical structures of the flash-type EEPROM.

Figure 8:
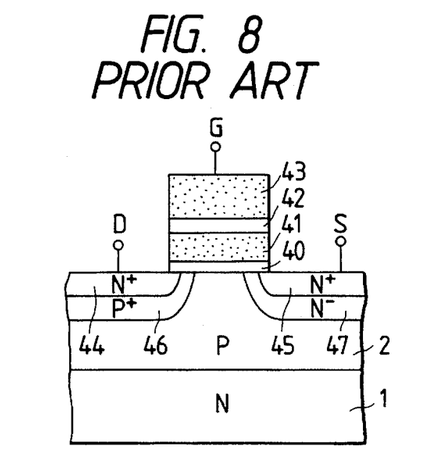
FIG. 8 is a sectional view showing a device structure of a conventional flash-type EEPROM of a stack gate structure.

The flash-type EEPROM of the stack gate structure as shown in FIG. 8 has a gate structure consisting of a tunnel oxide film 40, a floating gate 41, an insulating film 42 and a control gate 43. $N^+$ diffusion layers 44, 45 are formed in a p-well on both sides of the gate structure. A $p^+$ diffusion layer 46 is formed between the $n^+$ diffusion layer (drain) 44 and the p-well 2 to improve the injection efficiency of hot electrons. Further, an $n^-$ diffusion layer 47 is formed between the $n^+$ diffusion layer 45 and the p-well 2 to suppress the generation of hot holes due to the interband tunnel effect during the data erase operation.

Data writing to the flash-type EEPROM of the stack gate structure is effected by injecting hot electrons from the vicinity of the drain to the floating gate 41 by applying positive voltages to a gate terminal G and a drain terminal D and grounding a source terminal S. Data erasing is effected by removing signal charge from the floating gate 41 by applying a positive voltage to the source terminal S. (The source terminals S of all the devices on a substrate are connected to each other.) Data reading is effected by applying positive voltages to the gate terminal G and the drain terminal D, and judging whether a current flows between the drain and source.

Figure 9:
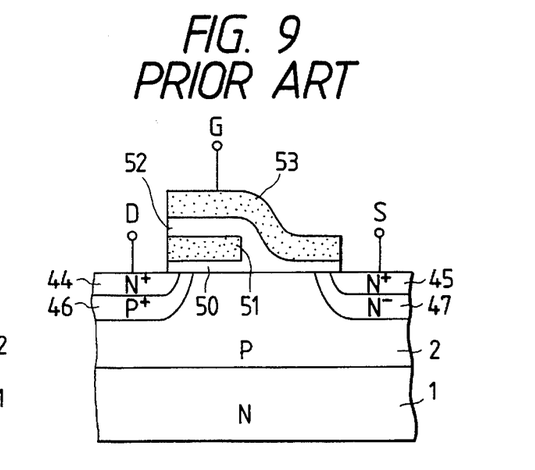
FIG. 9 is a sectional view showing a device structure of a conventional flash-type EEPROM of a split gate structure.

The flash-type EEPROM of the split gate structure as shown in FIG. 9 has a floating gate 51 on a tunnel oxide film 50 on the side of the drain. A selection gate 53 is formed on the floating gate 51 via an insulating film 52. Data writing to this device is effected by injecting hot electrons into the floating gate 51 by applying positive voltages to a gate terminal G and a drain terminals D. Data erasing is effected by transferring signal charge stored in the floating gate 51 to the drain by grounding or applying a negative voltage to the gate terminal G and applying a positive voltage to the drain terminal D. Data reading is effected by applying a positive low voltage to the gate terminal G and a positive voltage to the drain terminal D, and judging whether a current flows between the drain and source. Since the flash-type EEPROM of the split gate structure has the selection gate 53, there does not occur a problem of excessive erasing as occurs in the flash-type EEPROM of the stack gate structure (described later).

However, the conventional devices having the above structures are associated with the following problems.

In the full-future-type EEPROM, since a single memory cell consists of the memory transistor MTr and the selection transistor STr, the cell area is large, which becomes a disadvantage in realizing a more highly integrated memory device.

While the flash-type EEPROM of the stack gate structure is advantageous in realizing a more highly integrated memory device because of its structure of one transistor per cell, the total erasing time should be set at a longer period based on the erasing period of the device having the longest period required for erasing the signal charge since all cells in a substrate or in a p-well are subjected to the erasing operation at one time. This will cause a phenomenon that the signal charge is excessively removed from devices in which the signal charge erasing completes relatively earlier and positive charge is accumulated in the floating gate 41 of those devices. This phenomenon is called "excessive erasing." The excessive erasing causes a variation in a threshold at the time of the signal charge reading among the devices, which makes the reading operation unstable. For example, when the excessive erasing occurs, a channel is formed even in unselected devices due to the positive charge stored in the floating gate and a current flows between the source and the gate.

On the other hand, in the flash-type EEPROM of the split gate structure, even if the excessive erasing causes the accumulation of positive charge in the floating gate 51, no current flows between the source and the drain because a channel is not formed in the region of the p-well 2 immediately under the selection gate 53. However, because of its device structure, this type of EEPROM is inferior in the integration degree to the flash-type EEPROM of the stack gate structure.

In the conventional EEPROMs shown in FIGS. 6, 8 and 9, the area of the insulating film between the floating gate and the control gate is approximately the same as the area of the tunnel oxide film between the floating gate and the p-well. That is, a capacitance $C_D$ between the floating gate and the control gate is approximately the same as a capacitance C between the floating gate and the p-well. Therefore, a voltage applied to the control gate is equally allocated to the above insulating film and the tunnel oxide film. In order to effectively inject and remove electrons into and from the floating gate, the divided voltage across the tunnel oxide film should be made higher. This can be realized by thinning the insulating film between the floating gate and the control gate to increase the capacitance ratio $C_D/C$, which, however, will deteriorate the insulation between the floating gate and the control gate to cause a problem of leak current increase.

SUMMARY OF THE INVENTION

The present invention has been made in view of the above circumstances in the art, and has an object of providing a nonvolatile semiconductor memory device which can be highly integrated, and can provide a stable reading operation and improved insulation between a floating gate and a control gate.

Another object of the invention is to provide a manufacturing method for such a nonvolatile semiconductor memory device.

According to the invention, a nonvolatile semiconductor memory device having a memory transistor for performing a nonvolatile memory operation by injecting and removing electrons into and from a floating gate and a selection transistor for selecting the memory transistor, comprises:

a semiconductor substrate;

a first impurity diffusion layer acting as a drain of both of the memory transistor and the selection transistor, and a second impurity diffusion layer acting as a source of both of the memory transistor and the selection transistor, the first and second impurity diffusion layers being formed in the semiconductor substrate;

a tunnel insulating film formed on the semiconductor substrate on the side of the first diffusion layer;

a floating gate having a convex upper surface and formed on the tunnel insulating film in the vicinity of the first impurity diffusion layer; and a common gate acting both as a control gate of the memory transistor and as a gate of the selection transistor, one end of the common gate being located over the floating gate via an intergate insulating film, and the other end of the common gate being located on a gate insulating film in the vicinity of the second impurity diffusion layer.

Further, according to the invention, a manufacturing method of a nonvolatile memory device having a memory transistor for performing a nonvolatile memory operation by injecting and removing electrons into and from a floating gate and a selection transistor for selecting the memory transistor, comprises the steps of:

depositing a thin film on a semiconductor substrate in which a device area has been separately formed;

removing by etching a part of the thin film so that an end face of a residual part of the thin film is located in an area of the floating gate;

depositing a tunnel insulating film on the semiconductor substrate;

depositing a first conductive film on the semiconductor substrate;

anisotropically etching the first conductive film to leave, by self-aligning, a floating gate having a concave upper surface adjacent the end face of the residual thin film;

forming an intergate insulating film on the floating gate;

depositing a gate insulating film on the semiconductor substrate;

depositing a second conductive film on the semiconductor substrate;

removing by etching a part of the second conductive film to leave a common gate common to the memory transistor and the selection transistor so that one end of the common gate is located over the floating gate via the intergate insulating film and the other end of the common gate is located on the gate insulating film;

forming, by self-aligning, a first diffusion layer acting as a drain of both of the memory transistor and the selection transistor and a second diffusion layer acting as a source of both of the memory transistor and the selection transistor using the common gate as a mask; and forming leads that are respectively connected to the common gate and the first and second diffusion layer.

DESCRIPTION OF THE PREFERRED EMBODIMENTS

Embodiments of the present invention are described hereinafter with reference to the accompanying drawings.

Figure 1:
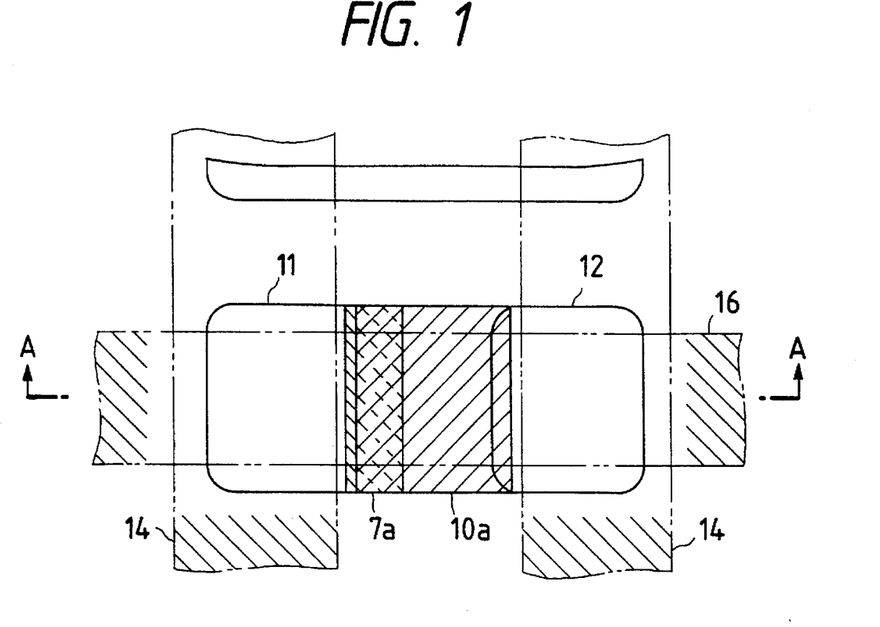
FIG. 1 is a plan view showing a device structure of a nonvolatile semiconductor memory device according to an embodiment of the present invention.
Figure 2:
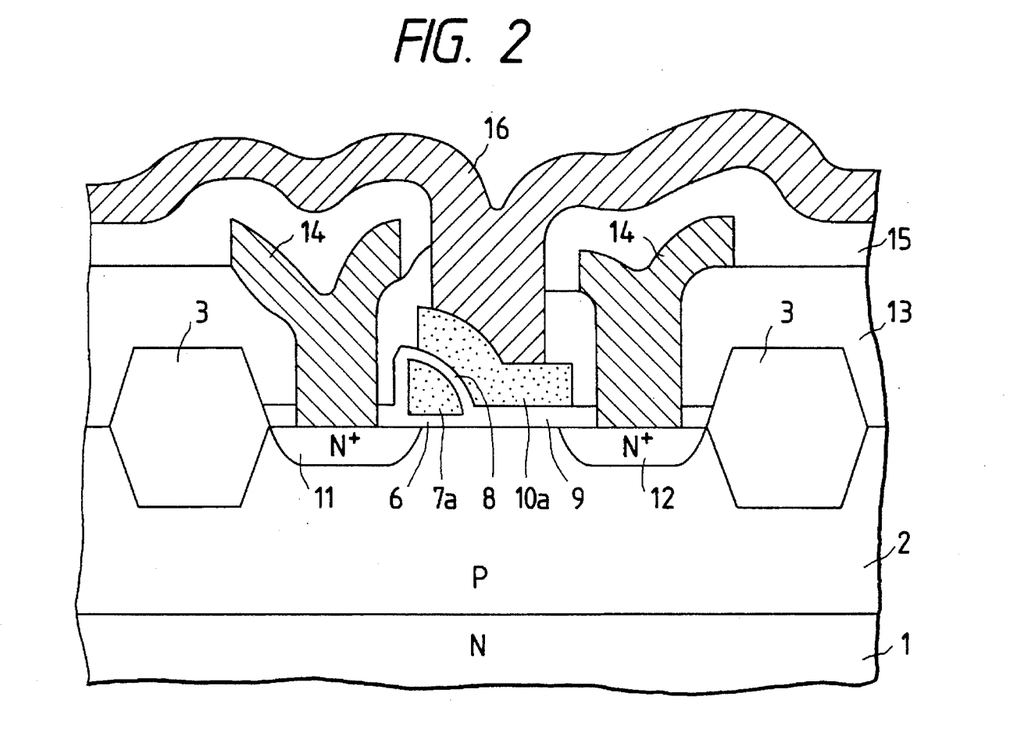
FIG. 2 is a sectional view taken along line A—A in FIG. 1.

FIG. 1 is a plan view of a memory cell of an EEPROM according to an embodiment of the invention, and FIG. 2 is a sectional view taken along line A—A in FIG. 1.

In FIG. 1, reference numeral 1 represents an n-type silicon substrate; 2, a p-well; and 3, field oxide films. An n⁺ drain diffusion layer 11 and an n⁺ source diffusion layer 12 are formed in a device forming region that is separated by the field oxide films 3. A floating gate 7a having a convex upper surface is formed by a self-aligning technique on a tunnel oxide film 6 in the vicinity of the drain diffusion layer 11. The drain-side end of a common gate 10a is positioned over the floating gate 7a via an insulating film 8, and the other end is positioned on a gate oxide film 9. Further, reference numeral 14 represents metal leads electrically connected to the drain diffusion layer 11 and the source diffusion layer 12, respectively; 16, a metal lead electrically connected to the common gate 10a; and 13 and 15, interlayer insulating films.

As shown in FIG. 2, in the memory cell according to this embodiment, a single transistor area includes a memory transistor and a selection transistor. The drain diffusion layer 11 and the source diffusion layer 12 commonly serve as the drain and the source of both the above transistors, respectively. A gate structure of the memory transistor consists of the tunnel oxide film 6, floating gate 7a, insulating film 8 and common gate 10a. The drain-side portion of the common gate 10a serves as the control gate. A gate structure of the selection transistor consists of the gate oxide film 9 and the source-side portion of the common gate 10a.

Figure 3:
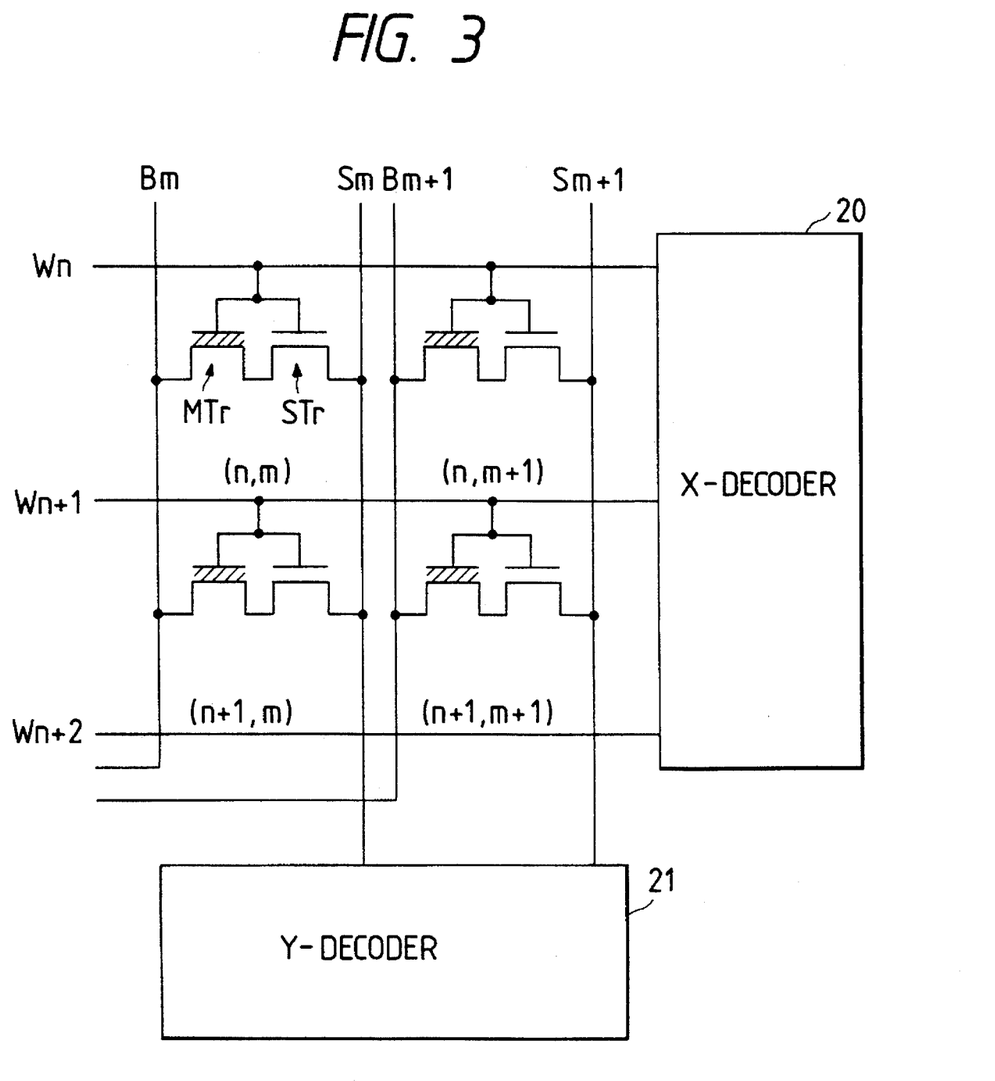
FIG. 3 is a circuit diagram showing part of a memory device employing the random access EEPROM of FIGS. 1 and 2.

Referring to FIG. 3, the operation of the EEPROM of this embodiment is described below. FIG. 3 is a circuit diagram showing part of a memory device using the random access EEPROM of this embodiment.

One memory cell consists of a memory transistor MTr and a selection transistor Str, and the memory cells are arranged in a matrix form. The common gates 10a of the transistors MTr and Str are connected to respective word lines $W_n$, $W_{n+1}$, $W_{n+2}$. The drains (drain diffusion layers 11) of the memory transistors MTr are connected to bit lines $B_m$, $B_{m+1}$. The sources (source diffusion layers 12) are connected to source lines $S_m$, $S_{m+1}$. In FIG. 3, reference numeral 20 represents an X-decoder for selecting among the word lines $W_n$, $W_{n+1}$, $W_{n+2}$, and numeral 21 represents an Y-decoder for selecting between the source lines $S_m$, $S_{m+1}$.

A data writing operation to a memory cell (n, m) of FIG. 3 is performed in the following manner. The bit line $B_m$ is given a write voltage $V_p$, the word line $W_n$ is given a "H" level voltage, and the source line $S_m$ is grounded. Writing to a memory cell (n, m+1), which is connected to the same word line $W_n$ as the memory cell (n, m), is prohibited by opening or grounding the bit line $B_{m+1}$ and the source line $S_{m+1}$. Writing to the remaining memory cells (n+1, m) and (n+1, m+1) is not effected because the word line $W_{n+1}$ is grounded or at a "L" level and the selection transistor STr is thereby turned off.

In the memory cell (n, m), hot electrons are injected into the floating gate 7a in the following manner. When the write voltage $V_P$ is applied to the drain diffusion layer 11, the source diffusion layer 12 is grounded, and the "H" level voltage is applied to the common gate 10a, a channel is formed from the source diffusion layer 12 towards the drain diffusion layer 11. By setting the write voltage $V_P$ at a proper value, the channel can develop so as to pass the portion located under the selection transistor STr (i.e., the portion immediately under the gate oxide film 9 that is located under the right portion of the common gate 10a; see FIG. 2) but not reach the drain diffusion layer 11. As a result, the electric field concentrates in the portion under the floating gate 7a and many hot electrons are generated there. Although part of the hot electrons thus generated flow into the drain diffusion layer 11, the remaining part are accelerated by the above electric field and injected into the floating gate 7a through the tunnel oxide film 6 to provide a data-written state.

Since the floating gate 7a of the memory cell of this embodiment has a convex upper surface, the area of the upper surface is larger than of the lower surface. Therefore, a capacitance $C_D$ between the common gate 10a and the floating gate 7a is larger than a capacitance C between the floating gate 7a and the p-well 2. The voltage applied to the common gate 10a is divided between the tunnel oxide film 6 and the insulating film 8, and the divided voltage across the tunnel oxide film 6 is proportional to a capacitance ratio $C_D/C$. Therefore, compared to the conventional memory cells in which the upper and lower capacitances $C_D$ and C are approximately equal to each other, in the memory cell of this embodiment the divided voltage across the tunnel oxide film 6 becomes larger by a value that originates from the larger capacitance ratio $C_D/C$, so that hot electrons can be injected into the floating gate 7a more efficiently. In other words, if hot electrons are to be injected at the same efficiency as the conventional memory cells, the voltage to be applied to the common gate 10a (i.e., word line) can be set at a smaller value, so that a voltage raising circuit incorporated in this type of memory device can be simplified. Further, if it is intended to set the capacitances $C_D$ and C at a similar value, the insulating film 8 can be thickened by an amount corresponding to an increase of the area between the floating gate 7a and the common gate 10a, so that the insulation between the floating gate 7a and the common gate 10a is improved and a leak current between those gates is reduced.

A data erasing operation to the memory cell (n, m) is performed in the following manner. The word line $W_n$ is given a "L" level voltage, and the bit line $B_m$ and source line $S_m$ are given an erase voltage $V_E$. Erasing to the memory cell (n, m+1), which is connected to the same word line $W_n$ as the memory cell (n, m), is prohibited because the bit line $B_{m+1}$ and the source line $S_{m+1}$ are grounded or opened. Erasing to the remaining memory cells (n+1, m) and (n+1, m+1) is not effected because the word line $W_{n+1}$ is at the "H" level. When the "L" level voltage is applied to the common gate 10a of the memory cell (n, m) and the erase voltage $V_E$ is applied to the drain diffusion layer 11, electrons stored in the floating gate 7a are transferred to the drain diffusion layer 11 through the tunnel oxide film 6. Thus, the data is erased.

An operation of reading data from the memory cell (n, m) is performed in the following manner. Whether a voltage drop has occurred is detected by grounding the source line $S_m$, applying a sense voltage $V_{SENSE}$ to the word line $W_n$, and applying a voltage $V_{CC}$ to the bit line $B_m$ via a resistor. That is, if data is written in the memory cell (n, m), in which case the memory transistor MTr is in an off state, a state of causing no voltage drop, i.e., data "1" is read out. On the other hand, if no data is written in the memory cell (n, m), in which case the memory transistor MTr is in an on state, a state of causing a voltage drop, i.e., data "0" is read out.

Next, referring to FIGS. 4(a) through 5(d), a manufacturing method of the memory cell according to the above embodiment is described.

Figure 4A:
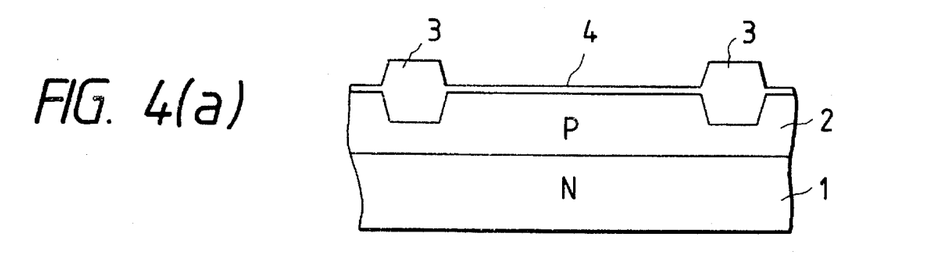
FIG. 4(a)–4(d) and 5(a)–5(d) are sectional views illustrating a first manufacturing method of the memory cell of FIGS. 1 and 2.

As shown in FIG. 4(a), field oxide films 3 for separating the device area and an oxide film 4 are formed after a p-well 2 is formed in an n-type silicon substrate 1.

Figure 4B:
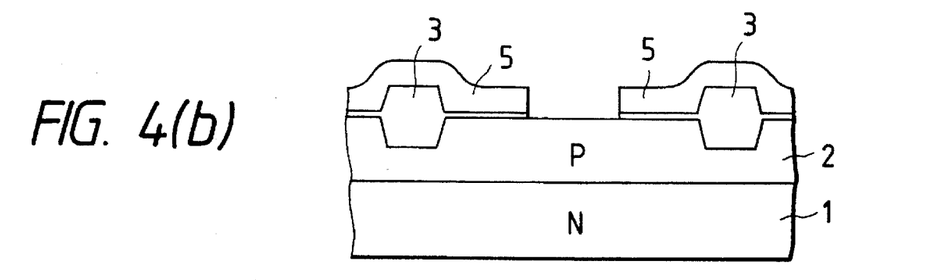

As shown in FIG. 4(b), after an oxide film 5 is deposited by a CVD method, the part of the deposited oxide film 5 corresponding to the transistor area in which a memory transistor and a selection transistor are to be formed is removed by anisotropic etching.

Figure 4C:
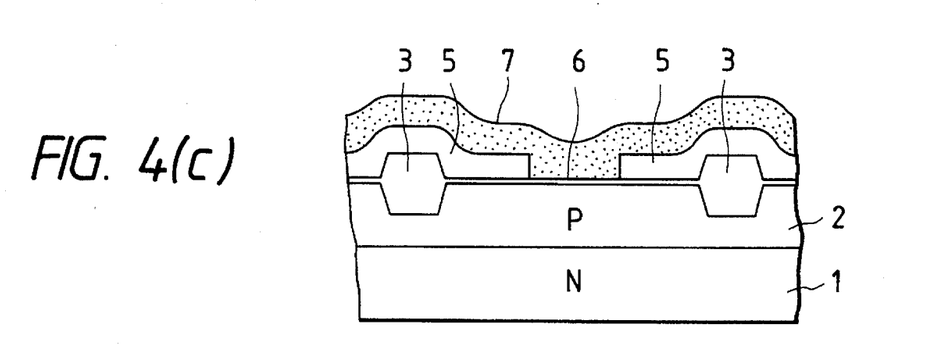

As shown in FIG. 4(c), in order to remove a roughness of the substrate surface, the substrate surface is re-oxidized and the oxide film thus formed is removed by wet etching. Then, after a tunnel oxide film 6 is formed in the transistor area, a conductive polysilicon film 7 is deposited.

Figure 4D:
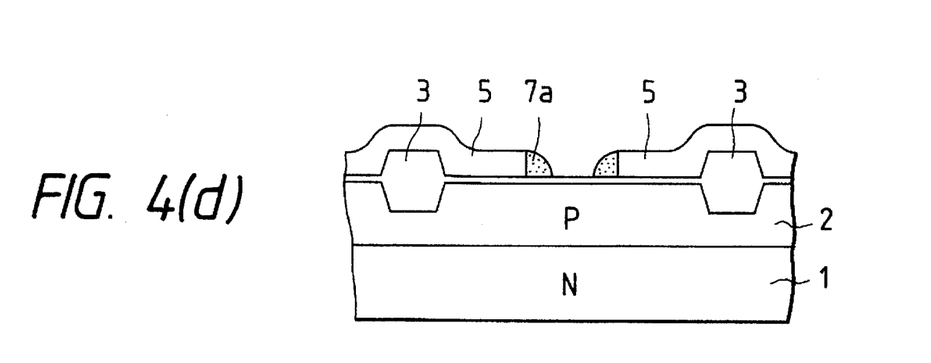

As shown in FIG. 4(d), etching-back is performed until the polysilicon film 7 on the oxide film 5 is entirely removed. As a result, polysilicon side walls are formed on window walls of the oxide film 5. The left-hand side wall will become the above described floating gate 7a of the memory transistor MTr. The gate length of the floating gate 7a can be controlled to be within the size of the design rules by changing the thickness of the oxide film 5, etching conditions, and other factors.

Figure 5A:
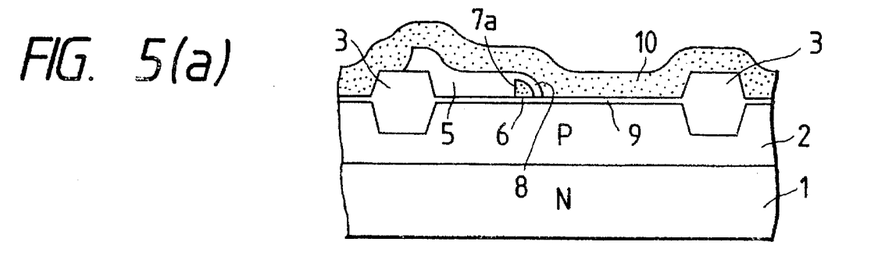
Figure 5B:
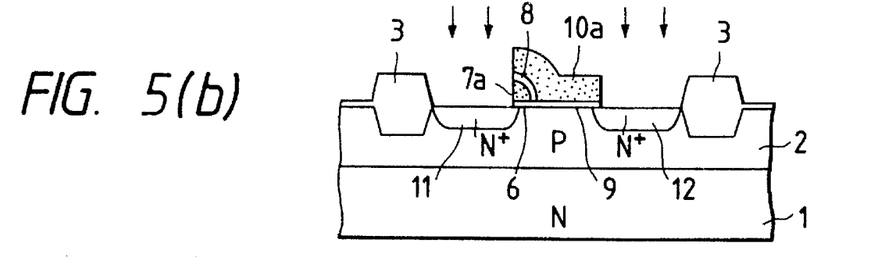

As shown in FIG. 5(a), while the left-hand side wall, i.e., the floating gate 7a and part of the oxide film 5 are masked by a photoresist pattern, the right-hand side wall and the remaining part of the oxide film 5 are removed by etching. Then, after the photoresist pattern is removed, an insulating film (silicon oxide film) 8 is formed on the floating gate 7a by thermal oxidation. After the oxide film in the selection transistor area is removed by wet etching, a gate oxide film 9 is formed. Then, a polysilicon film 10 is deposited.

As shown in FIG. 5 (b), while the transistor area is masked by a photoresist pattern, the non-masked part of the polysilicon film 10 and the oxide film 5 are removed by anisotropic etching. As a result, a common gate 10a is formed that serves both as the control gate of the memory transistor and as the gate of the selection transistor. After the oxide film 9 in the drain and source areas is removed, n-type impurity ions of, e.g., phosphorus or arsenic are injected to form a drain diffusion layer 11 and a source diffusion layer 12.

Figure 5C:
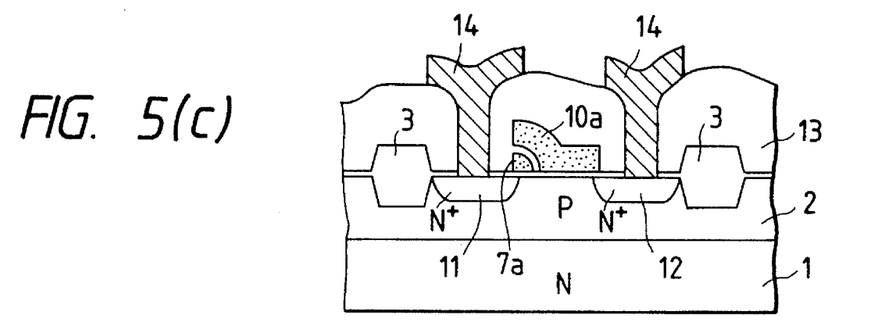

As shown in FIG. 5(c), thermal oxidation is again performed to form an oxide film on the substrate surface. After an interlayer insulating film 13 of, e.g., phosho-silicate glass (PSG) is deposited, contact holes are formed in its drain and source areas and then a metal film of, e.g., Al—Si is deposited. The metal film is patterned by photoetching to form metal leads 14 that are connected to the drain and source, respectively.

Figure 5D:
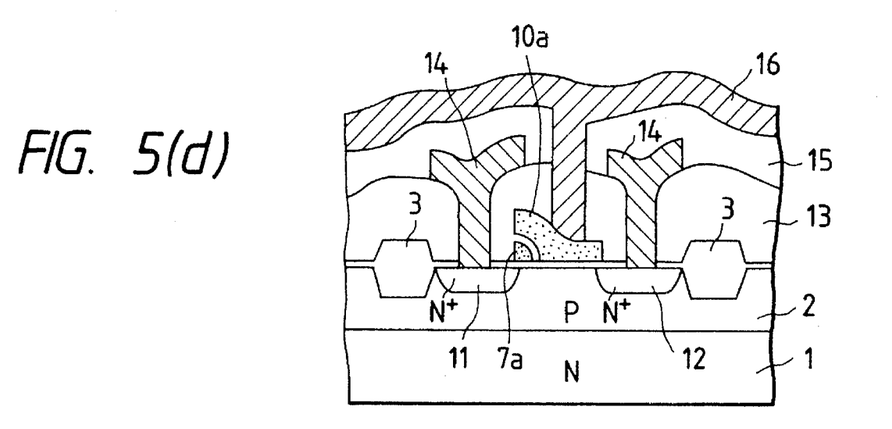

As shown in FIG. 5(d), after an interlayer insulating film 15 is deposited, a contact hole is formed in the gate area and then a metal layer is deposited. The metal layer is patterned to form a metal lead that is connected to the common gate 10a.

Next, referring to FIGS. 10(a) through 11(d), a second manufacturing method of the memory cell according to the embodiment of FIGS. 1 and 2 is described below.

Figure 10A:
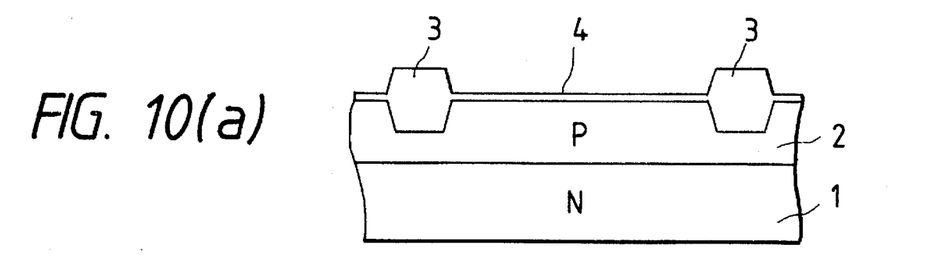
FIGS. 10(a)–10(d) and 11(a)–11(d) are sectional views illustrating a second manufacturing method of the memory cell of FIGS. 1 and 2.

As shown in FIG. 10(a), field oxide films 3 for separating the device area and an oxide film 4 are formed after a p-well 2 is formed in an n-type silicon substrate 1.

Figure 10B:
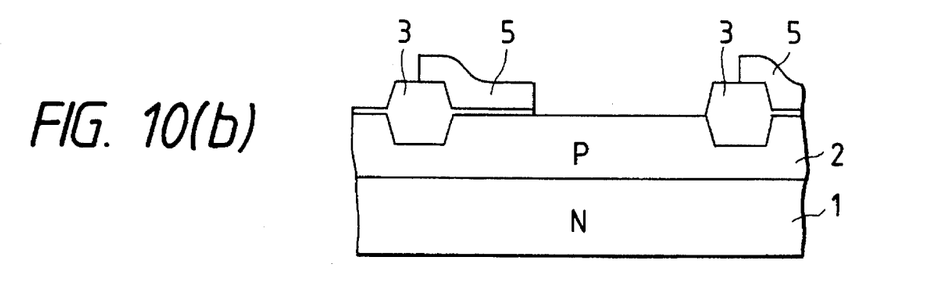

As shown in FIG. 10(b), for instance a silicon oxide film 5 is deposited, by a CVD method, on the silicon substrate 1 on which the device area has been separately formed as described above. Then, the part of the oxide film 5 that corresponds to the common gate of the memory transistor and the selection transistor is removed by anisotropic etching. In this case, the patterning is made so that the end of the oxide film 5 is positioned in a portion in which a floating gate 7a is to be formed.

Figure 10C:
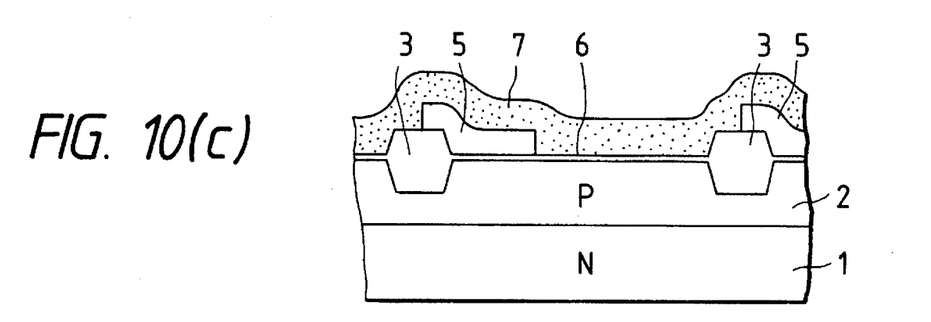

As shown in FIG. 10(c), in order to remove a roughness of the substrate surface, the substrate surface is re-oxidized and the oxide film thus formed is removed by wet etching. Then, for instance a tunnel oxide film 6 is formed in the transistor area, and then a polysilicon film 7 is deposited. The polysilicon film 7 exhibits conductivity because of doping of phosphorus, arsenic, etc.

Figure 10D:
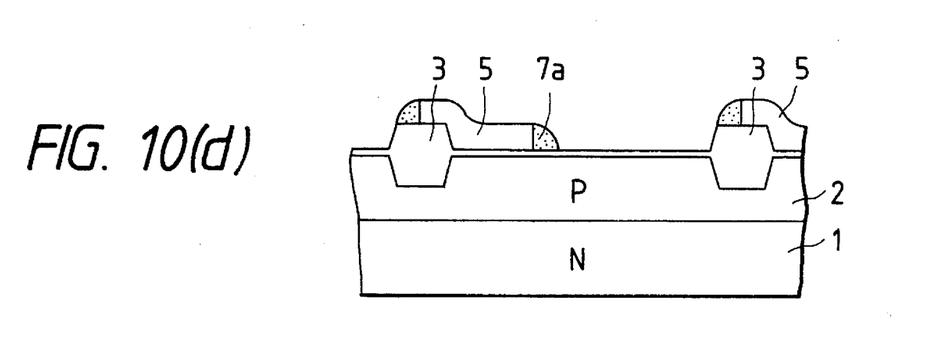

As shown in FIG. 10(d), etching-back is performed until the polysilicon film 7 on the oxide film 5 is entirely removed. As a result, polysilicon side walls are formed on end walls of the oxide film 5. The side wall formed in the common gate area will become the above-mentioned floating gate 7a of the memory transistor MTr. The gate length of the floating gate 7a can be controlled to be within the size of the design rules by changing the thickness of the oxide film 5 and etching conditions.

Figure 11A:
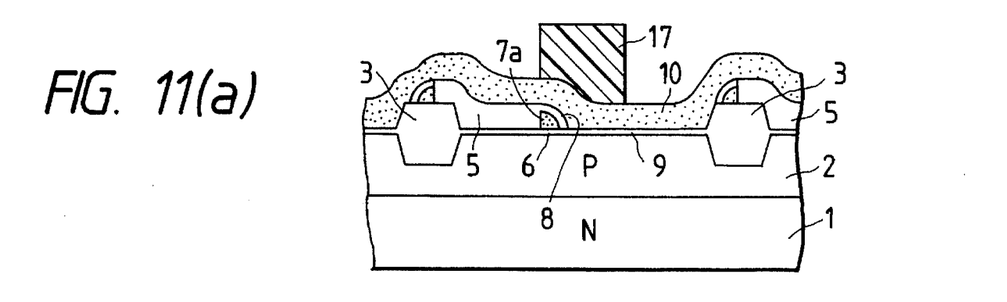

As shown in FIG. 11(a), an insulating film (silicon oxide film) 8 is formed on the floating gate 7a by reoxidizing. After the oxide film in the gate area other than the area of the floating gate 7a is removed by photoetching, a gate oxide film 9 is formed. Then, a polysilicon film 10 is deposited. While the part of the polysilicon film 10 that corresponds to the gate area is masked by a photoresist pattern 17, the remaining part of the polysilicon film 10 is removed by anisotropic etching. As a result, the common gate 10a is formed whose one end is located on the floating gate 7a via the insulating film 8 and other end is located on the gate oxide film 9.

Figure 11B:
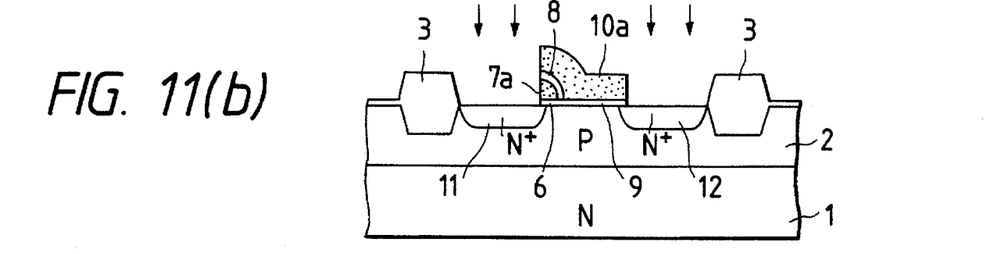

As shown in FIG. 11(b), after the oxide film 9 in the drain and source areas is removed, n-type impurity ions of, e.g., phosphorus or arsenic are injected with the common gate 10a and the field oxide films 3 used as a mask, to form a drain diffusion layer 11 and a source diffusion layer 12 (self-aligning process).

Figure 11C:
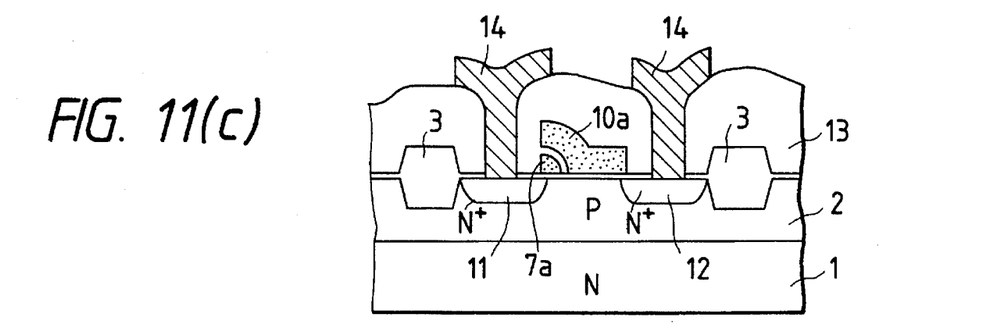

As shown in FIG. 11(c), thermal oxidation is again performed to form an oxide film on the substrate surface. After an interlayer insulating film 13 of, e.g., phosphosilicate glass (PSG) is deposited, contact holes are formed in its drain and source areas and then a metal film of, e.g., Al—Si is deposited. The metal film is patterned by photoetching to form metal leads 14 that are connected to the drain and source, respectively.

Figure 11D:
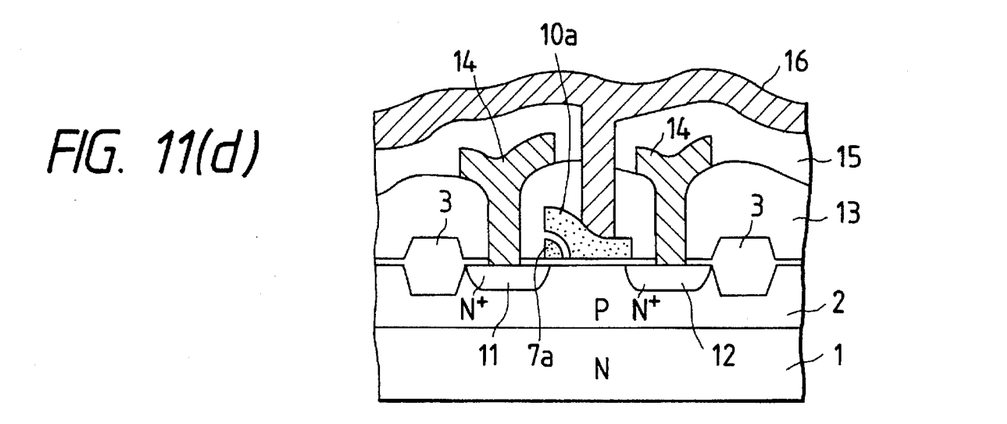

As shown in FIG. 11(d), after an interlayer insulating film 15 is deposited, a contact hole is formed in the gate area and then a metal layer is deposited. The metal layer is patterned to form a metal lead that is connected to the common gate 10a.

Although the above embodiments are described of the n-channel EEPROM, it is apparent that the invention can also be applied to the p-channel EEPROM.

As described above in connection with the conventional devices of FIGS. 8 and 9, a $p^+$ diffusion layer may be additionally provided between the drain diffusion layer 11 and the p-well 2 in the memory cell of FIGS. 1 and 2 to improve the injection efficiency of hot electrons. Further, to increase the breakdown voltage, an $n^-$ diffusion layer may be inserted between the source diffusion layer 12 and the p-well 2.

As is apparent from the above description, since the invention makes it possible to easily form the memory transistor and the selection transistor (i.e., two transistors) in one transistor area, the memory cell area can be reduced to increase the integration degree of semiconductor memory devices.

Since data can be erased on a bit-by-bit basis by turning on/off the selection transistor, the excessive erasing problem does not occur in the invention in contrast to the conventional flash-type EEPROM of the stack gate structure. Therefore, the data reading operation can be stabilized.

Since the floating gate has the convex upper surface, the capacitance between the floating gate and the common gate becomes larger than the capacitance between the floating gate and the substrate, to increase the divided voltage across the tunnel insulating film. As a result, the efficiency of injecting carriers into the floating gate is increased, and the voltage applied to the word line during the data write or erase operation can be set at a relatively low value, so that a voltage raising circuit incorporated in the memory device can be simplified as much.

Where the efficiency of injecting and removing carriers into and from the floating gate is set the same as the conventional case, the insulating film between the floating gate and the control gate can be thickened by an amount corresponding to the increase of the area between those two gates. As a result, the insulation between those two gates is improved and a leak current is reduced.

What is claimed is:

1. A nonvolatile semiconductor memory device having a memory transistor for performing a nonvolatile memory operation by injecting and removing electrons into and from a floating gate through a tunnel insulating film and a selection transistor for selecting the memory transistor, said nonvolatile semiconductor memory device comprising:

a semiconductor substrate;

a first impurity diffusion layer acting as a drain of both of the memory transistor and the selection transistor, and a second impurity diffusion layer acting as a source of both of the memory transistor and the selection transistor, the first and second impurity diffusion layers being formed in the semiconductor substrate;

a tunnel insulating film formed on the semiconductor substrate adjacent to the first impurity diffusion layer and spaced from the second impurity diffusion layer;

a floating gate formed on the tunnel insulating film adjacent to the first impurity diffusion layer and spaced from the second impurity diffusion layer;

the floating gate having a lower surface extending along the tunnel insulating film parallel to the substrate, a side surface extending upwardly from the lower surface at the end thereof adjacent to the first impurity diffusion layer, and an upper surface having a convex shape throughout its length and extending from a first end intersecting the end of the lower surface spaced from the second impurity diffusion layer to a second end intersecting the upper end of the side surface; and a common gate acting both as a control gate of the memory transistor and as a gate of the selection transistor, one end of the common gate being located over and terminating above the floating gate, the common gate being spaced from the floating gate by an intergate insulating film, and the other end of the common gate being located on a gate insulating film between the floating gate and the second impurity diffusion layer, the convex upper surface of the floating gate having its first end adjacent to the intersection of the tunnel insulating film and the gate insulating film and its second end spaced upwardly from the tunnel insulating film and laterally from the gate insulating film and adjacent to the termination of the common gate.

* * * * *